United States Patent [19]

Griffin et al.

[11] Patent Number: 5,252,359
[45] Date of Patent: Oct. 12, 1993

[54] CVD PROCESS FOR THE MANUFACTURE OF CERAMIC FIBERS

[75] Inventors: Christopher J. Griffin, Middlesex; Renny N. Moss, Surrey, both of England

[73] Assignee: The British Petroleum Company p.l.c., London, England

[21] Appl. No.: 960,210

[22] Filed: Oct. 13, 1992

Related U.S. Application Data

[63] Continuation of Ser. No. 673,432, Mar. 22, 1991, abandoned.

[30] Foreign Application Priority Data

Mar. 31, 1990 [GB] United Kingdom ............... 9007273

[51] Int. Cl.⁵ .............................................. C23C 16/00
[52] U.S. Cl. ................................. 427/249; 427/255.1; 427/255.5; 427/248.1; 427/314; 427/545; 427/122
[58] Field of Search ............... 427/249, 255.1, 255.5, 427/248.1, 314, 122, 545

[56] References Cited

U.S. PATENT DOCUMENTS

| | | | |
|---|---|---|---|
| 3,130,073 | 4/1965 | Dijksterhuis et al. | 427/78 |
| 3,177,094 | 4/1964 | Linden et al. | 428/368 |
| 4,863,760 | 9/1989 | Schantz et al. | 427/163 |
| 4,873,115 | 10/1989 | Matsumura et al. | 427/34 |
| 4,994,221 | 2/1991 | Tanaka et al. | 264/81 |

FOREIGN PATENT DOCUMENTS

0353934A1 2/1990 European Pat. Off.
2031954 4/1980 United Kingdom.

*Primary Examiner*—Roy King
*Attorney, Agent, or Firm*—David P. Yusko; Michael F. Esposito; David J. Untener

[57] ABSTRACT

A process for depositing a coating on a filament, which comprises heating the filament and passing the heated filament through a deposition chamber containing gases which on contact with the hot filament deposit the coating; characterized in that said gases comprise chloroform and a hydrocarbon having 1 to 6 carbon atoms, a carbon coating being produced.

10 Claims, 2 Drawing Sheets

CVD PROCESS FOR THE MANUFACTURE OF CERAMIC FIBERS

This is a continuation of co-pending application Ser. No. 07/673,432 filed on Mar. 22, 1991 now abandoned.

This invention relates to a process for the manufacture of ceramic fibres.

It is well known to deposit ceramic coatings on filaments using chemical vapour deposition techniques. In a typical process, a filament is passed continuously through a deposition chamber containing gases which on contact with the hot filament deposit the desired coating. The filament is usually heated by passage of an electric current.

It is known to pass a filament through a deposition chamber comprising halogenated hydrocarbons. Typically, EP-A-353934 discloses a process for depositing a carbon coating on a fibre in which the fibre is contacted with at least one halogenated aliphatic hydrocarbon.

It is also known to pass a filament through a deposition chamber comprising hydrocarbons. Typically, JP-A-61219708 and JP-A-60145375 disclose the use of various gaseous hydrocarbons.

Surprisingly, we have found that if the deposition chamber comprises both a halogenated hydrocarbon and a hydrocarbon, a carbon coated filament is obtained which has improved qualities over the coated filaments of the known prior art.

Accordingly, the present invention provides a process for depositing a coating on a filament, which comprises heating the filament and passing the heated filament through a deposition chamber containing gases which on contact with the hot filament deposit the coating; characterised in that said gases comprise chloroform and a hydrocarbon having 1 to 6 carbon atoms, a carbon coating being produced.

Any suitable C(1-6) hydrocarbon may be used, for example propane or, especially, propene.

The gases in the deposition chamber may contain further components, for example an inert carrier gas such as argon or neon. Hydrogen may be present if desired, or the reaction may be carried out in the absence of hydrogen.

The volume ratio of chloroform to C(1-6) hydrocarbon may vary widely, but is preferably in the range of from 3:1 to 1:8, especially 2:1 to 1:4. If an inert carrier gas is used, the volume ratio of C(1-6) hydrocarbon to carrier gas is preferably in the range of from 1:6 to 1:40, especially 1:10 to 1:20.

The deposition chamber is preferably a vertical tube. It has been found that especially good results are obtained when the gas inlet is at the lower end of the tube and the outlet at the upper end.

The process according to the invention may be used for depositing a carbon coating on any desired filament. The filament may for example be tungsten, or carbon requiring a further carbon layer. Preferably however the filament is a ceramic filament, for example boron or, especially, silicon carbide. Such filaments are well known, and their manufacture described in many publications, for example U.S. Pat. No. 4,127,659 and U.S. Pat. No. 3,622,369.

In order to promote efficient deposition, the filament is preferably heated to a temperature in the range of from 800° to 1300° C., especially 900° to 1100° C. Most conveniently, the filament is heated by passage of an electric current supplied via two liquid metal electrodes through which the filament passes. These electrodes may contain pure mercury, or liquid metal mixtures selected from mercury/indium, mercury/cadmium or gallium/indium.

The filaments produced by the process of the invention are particularly useful for the preparation of titanium-based composites. Such composites may be prepared by embedding filaments in a matrix of titanium, titanium alloy or titanium intermetallic, under the action of heat.

Commercially available chloroform may be used to carry out the present invention. The chloroform may contain levels of impurities, e.g. alcohols which function as stabilising agents to prevent dissociation of the molecule during storage. Typical stabilising agents include ethanol and/or amylene (tertiary amyl alcohol); these are typically present in concentrations of 1-3% volume and 20-40 ppm respectively.

The present invention will now be described in greater detail:

1. GENERAL METHOD

Figure 1:
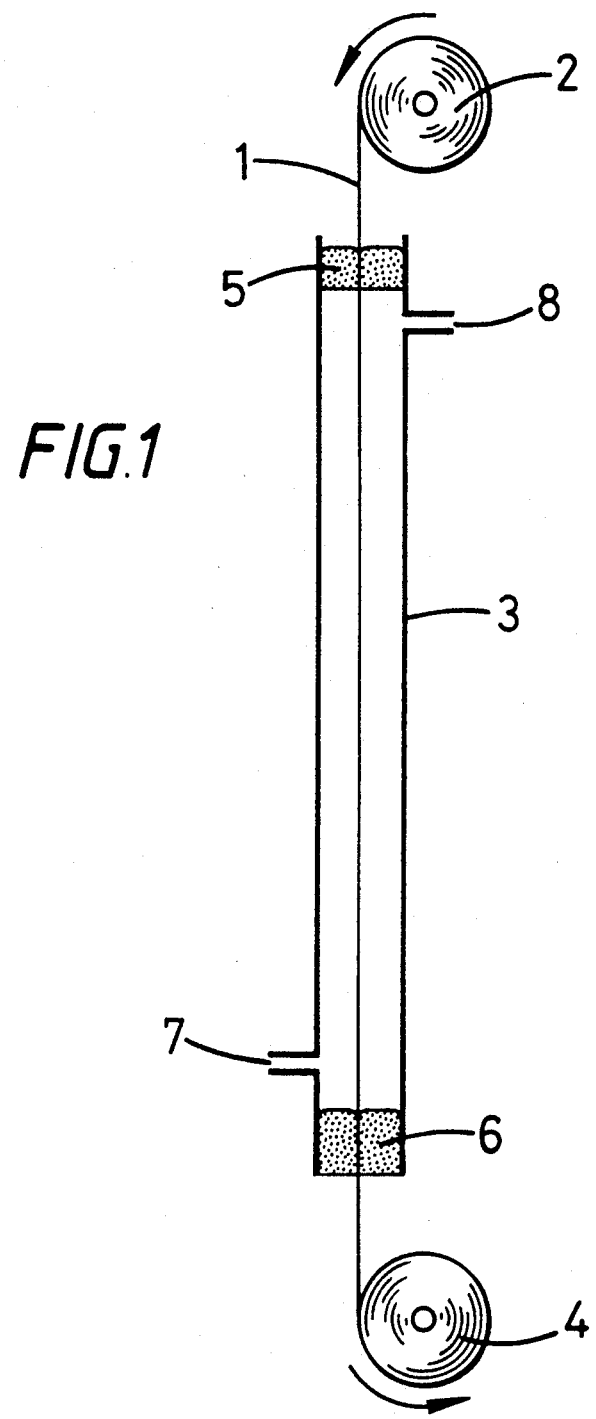
FIG. 1 is an illustrative view of an apparatus used in carrying out the present invention.

FIG. 1, of the accompanying drawings, shows an apparatus which may be used to carry out the invention. A filament 1, for example silicon carbide with a tungsten core, is fed from a supply 2 via a tube 3 to a store 4. The filament 1 passes through mercury electrodes 5 and 6 at the ends of the tube 3. The electrodes 5 and 6 form part of an electric circuit (not shown) which supplies an electric heating current to the filament, raising it to a temperature typically of from 800° to 1100° C., e.g. 900° to 1100° C. Argon (flow rate 1000 to 2000 standard cubic centimeters per minute (sccm)), propene (flow rate 5 to 125 sccm) and commercial chloroform ex BDH containing 1-3% ethanol, (40 to 160 sccm e.g. 30 to 70 sccm) are fed into the tube 2 via inlet 7, and spent gases removed via outlet 8. Filament entering the store 4 has a high-quality carbon coating.

2. TESTS

Fibre Strength Test

The coated fibres were tensile tested over a 25 mm gauge length. Aluminium grips were used to clamp and protect the fibres during testing. Tension was applied and the resulting force which caused the fibre to break was recorded. The mean of ten tests was used to calculate the fibre strength.

3. EXAMPLES

Comparative Example 1. Propene Only

The aforementioned procedure was carried out using propene only. Propene was fed into the deposition chamber under a flow rate of 200 cm$^3$min$^{-1}$ and an argon flow rate of 1400 cm$^3$min$^{-1}$. The filament was heated to 800°-1100° C. It was not possible to identify a coating using scanning electron microscopy (SEM). A thin coating of 50 nm was identified using secondary ion mass spectroscopy (SIMS).

COMPARATIVE EXAMPLE 2. CHLOROFORM ONLY

Figure 2:
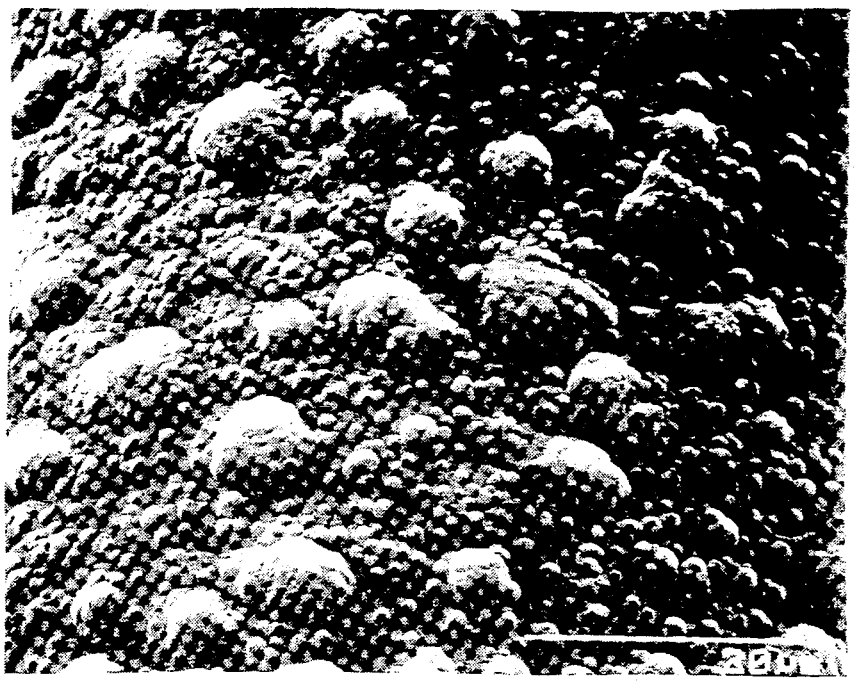
FIG. 2 is a micrograph of the resultant carbon coating using chloroform only.

The procedure of Comparative Example 1 was repeated in the absence of propene but under a flow rate 80 cm$^3$min$^{-1}$ of chloroform. The resulting coating is 0.8 µm in thickness and is shown in FIG. 2. The coating is nodular in appearance, exhibits poor adhesion and gives a fibre strength of 3.33 GPa.

EXAMPLE 1. PROPENE AND CHLOROFORM

Figure 3:
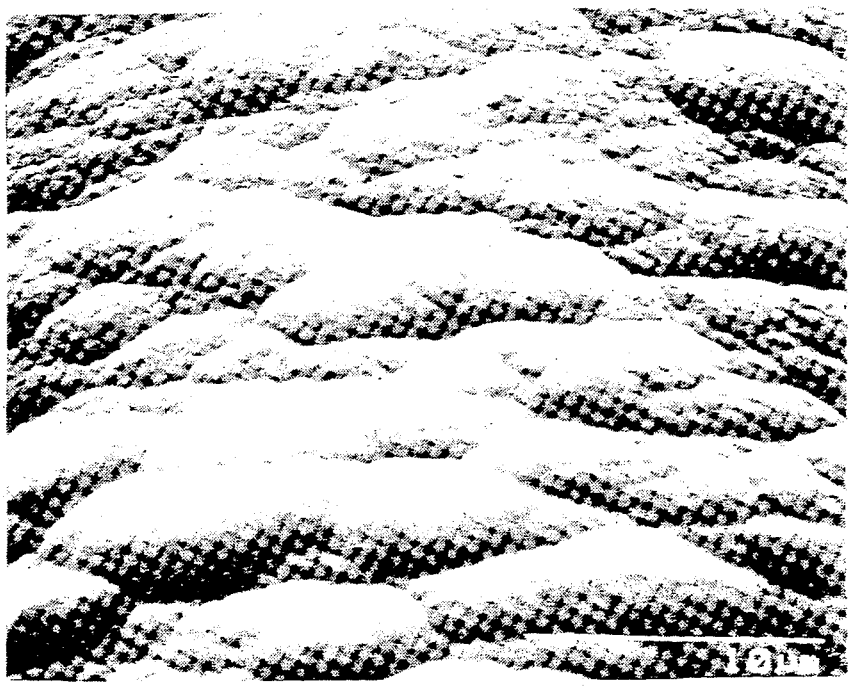
FIG. 3 is a micrograph of the resultant carbon coating using propene and chloroform.

The procedure of Comparative Example 2 was repeated in the presence of propene (flow rate of 75 cm$^3$min$^{-1}$). The resulting coating is 0.5 µm in thickness and is shown in FIG. 3. The coating is visibly smoother than that obtained from using only chloroform, exhibits good adhesion and gives a fibre strength of 4.02 GPa.

We claim:

1. In a process for depositing a carbon coating on a filament, which comprises heating the filament and passing the heated filament through a deposition chamber containing gases which on contact with the heated filament deposit the coating; the improvement comprising that said gases comprise chloroform and a hydrocarbon having 1 to 6 carbon atoms.

2. A process as claimed in claim 1, in which the hydrocarbon is propene.

3. A process as claimed in claim 1, in which the volume ratio of the chloroform to the hydrocarbon is in the range of from 3:1 to 1:8.

4. A process as claimed in claim 3, in which the volume ratio of the chloroform to the hydrocarbon is in the range of from 2:1 to 1:4.

5. A process as claimed in claim 1, in which the gases in the deposition chamber contain an inert carrier gas.

6. A process as claimed in claim 1, in which the filament is heated to a temperature in the range of from 800° to 1300° C.

7. A process as claimed in claim 6, in which the filament is heated to a temperature in the range of from 900° to 1100° C.

8. A process as claimed in claim 1, in which the deposition chamber is a vertical tube, the gas inlet is at the lower end of the tube and the gas outlet at the upper end.

9. A process as claimed in claim 1, in which said carbon coating is deposited on a ceramic filament.

10. A process as claimed in claim 9, in which said carbon coating is deposited on a silicon carbide filament.

* * * * *